(12) United States Patent
Toshikawa et al.

(10) Patent No.: US 10,840,882 B2
(45) Date of Patent: Nov. 17, 2020

(54) CRYSTAL UNIT AND MANUFACTURING METHOD THEREOF

(71) Applicant: NIHON DEMPA KOGYO CO., LTD., Tokyo (JP)

(72) Inventors: Koji Toshikawa, Saitama (JP); Shinobu Yoshida, Saitama (JP); Hirokazu Iwata, Saitama (JP); Tetsuya Watanabe, Saitama (JP); Kazuhiro Hirota, Saitama (JP); Yoshiro Teshima, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/391,332

(22) Filed: Apr. 23, 2019

(65) Prior Publication Data

US 2019/0326882 A1    Oct. 24, 2019

(30) Foreign Application Priority Data

Apr. 24, 2018 (JP) .................. 2018-083297
Sep. 25, 2018 (JP) .................. 2018-178676

(51) Int. Cl.
| | |
|---|---|
| *H03B 5/32* | (2006.01) |
| *H03H 9/19* | (2006.01) |
| *H03H 9/02* | (2006.01) |
| *H03H 3/02* | (2006.01) |
| *H01L 21/306* | (2006.01) |

(52) U.S. Cl.
CPC .............. *H03H 9/19* (2013.01); *H03B 5/32* (2013.01); *H03H 3/02* (2013.01); *H03H 9/02* (2013.01); *H01L 21/30608* (2013.01); *H03B 2200/0018* (2013.01)

(58) Field of Classification Search
CPC .. H01L 41/18; H03B 5/30; H03B 5/32; H03B 2200/0018; H03H 3/02; H03H 9/02023; H03H 9/17; H03H 9/19; H03H 2003/022
USPC ........................................................ 331/158
See application file for complete search history.

(56) References Cited

U.S. PATENT DOCUMENTS

| | | | | |
|---|---|---|---|---|
| 5,304,887 | A * | 4/1994 | Heinecke | H03H 9/19 310/361 |
| 7,235,913 | B2 * | 6/2007 | Iwata | H03H 3/04 310/320 |
| 2003/0006853 | A1 * | 1/2003 | Yamanaka | G01G 3/13 331/158 |
| 2005/0200240 | A1 * | 9/2005 | Tanaka | H03H 9/1021 310/333 |

(Continued)

FOREIGN PATENT DOCUMENTS

| | | |
|---|---|---|
| JP | 2014027505 | 2/2014 |
| JP | 2016197778 | 11/2016 |

*Primary Examiner* — Levi Gannon
(74) *Attorney, Agent, or Firm* — JCIPRNET

(57) ABSTRACT

A crystal unit includes an AT-cut crystal element that has a planar shape in a rectangular shape and a part as a thick portion. The crystal element includes a first end portion, a depressed portion, the thick portion, and a second end portion in this order from a side of one short side in viewing a cross section taken along a longitudinal direction near a center of the short side. The depressed portion is a depressed portion disposed from the thick portion toward the first end portion side, depressed with a predetermined angle θa and subsequently bulged, and connected to the first end portion.

12 Claims, 15 Drawing Sheets

(56) References Cited

U.S. PATENT DOCUMENTS

| | | | |
|---|---|---|---|
| 2005/0231078 A1* | 10/2005 | Tanaka | H03H 9/02086 310/333 |
| 2010/0164325 A1* | 7/2010 | Onoe | H03H 9/19 310/320 |
| 2013/0328637 A1* | 12/2013 | Ishii | H03H 9/0542 331/155 |
| 2014/0292436 A1* | 10/2014 | Kikushima | H01L 41/0913 331/158 |
| 2015/0303896 A1* | 10/2015 | Lim | H03H 9/19 310/361 |
| 2018/0006630 A1* | 1/2018 | Kojo | H03H 9/17 |
| 2018/0076792 A1* | 3/2018 | Asai | H03H 9/02023 |
| 2018/0226943 A1* | 8/2018 | Kidu | H01L 41/338 |
| 2020/0014366 A1* | 1/2020 | Ikeda | H03H 9/19 |

* cited by examiner

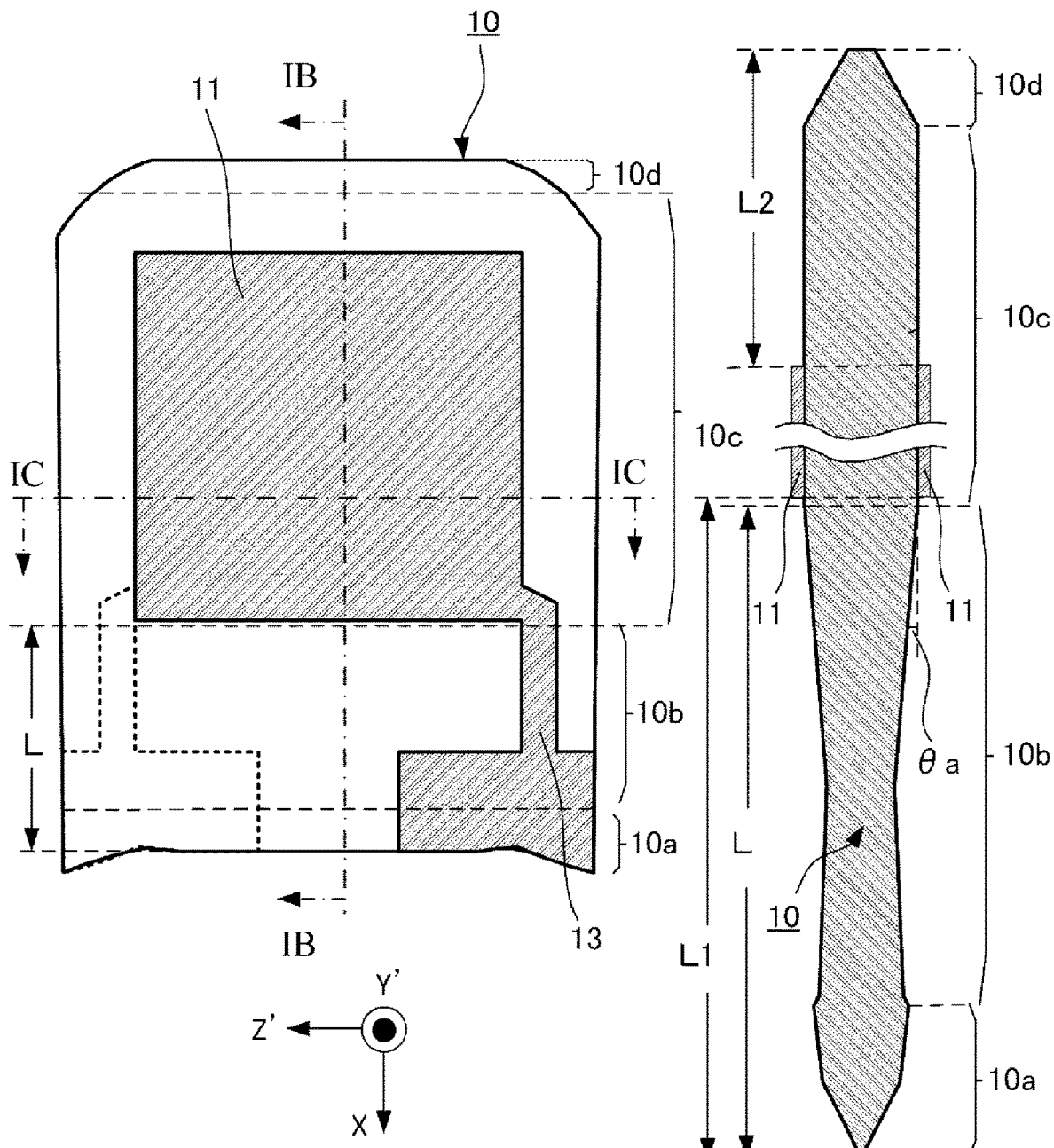

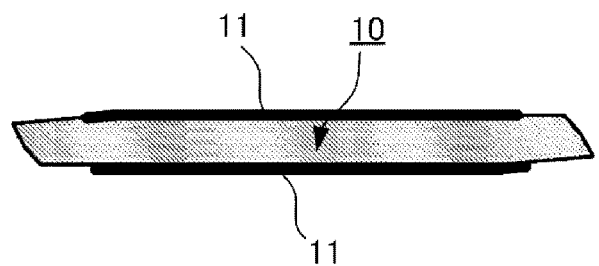
FIG. 11C
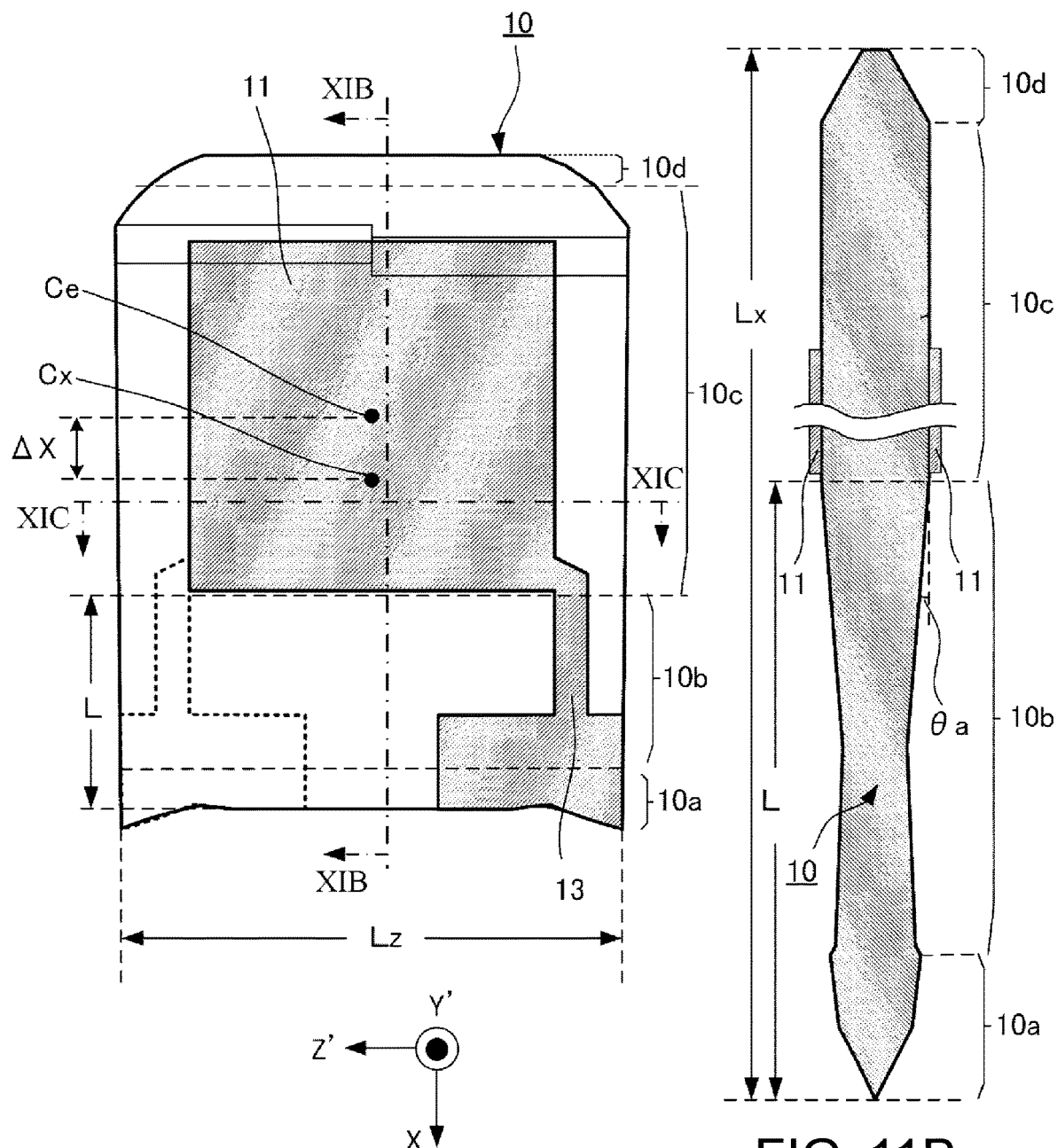
FIG. 11A
FIG. 11B

CRYSTAL UNIT AND MANUFACTURING METHOD THEREOF

CROSS-REFERENCE TO RELATED APPLICATIONS

This application is based on and claims priority under 35 U.S.C. § 119 to Japanese Patent Application No. 2018-083297, filed on Apr. 24, 2018, and Japanese Patent Application No. 2018-178676, filed on Sep. 25, 2018. The entire content of which is incorporated herein by reference.

TECHNICAL FIELD

This disclosure relates to a crystal unit using an AT-cut crystal element and a manufacturing method of the crystal unit.

DESCRIPTION OF THE RELATED ART

As downsizing of an AT-cut crystal unit proceeds, it has become difficult to manufacture crystal elements for crystal units by a manufacturing method of mechanical processing. Accordingly, an AT-cut crystal element manufactured using a photolithography technique and a wet etching technique has been developed.

For example, Japanese Unexamined Patent Application Publication No. 2014-27505 has disclosed a crystal unit that uses an AT-cut crystal element manufactured by the above-described technique. Specifically, Paragraph 0053 and FIG. 6 in Japanese Unexamined Patent Application Publication No. 2014-27505 disclose a crystal unit where a side surface on a +X-side among side surfaces (X-surfaces) intersecting with an X-axis of a crystal is constituted of six surfaces and a side surface on a −X-side is constituted of two surfaces, and a part of this crystal unit is configured as a thick portion (mesa-shaped). This crystal unit can achieve a crystal unit that has a low crystal impedance (CI) value and an improved frequency versus temperature characteristic (Paragraph 0008 in Japanese Unexamined Patent Application Publication No. 2014-27505).

The crystal unit in Japanese Unexamined Patent Application Publication No. 2014-27505 has a mesa structure and includes a thick portion, inclined portions connected to both sides of the thick portion, and a thin portion connected to these inclined portions. The inclined portion includes two inclined portions of a +X-side inclined portion (a crystal surface 133 in FIG. 6B in Japanese Unexamined Patent Application Publication No. 2014-27505) and a −X-side inclined portion (an inclined surface 23 in the identical drawing).

Then, it is described that an angle between an inclined surface of the +X-side inclined portion and a normal line of a principal surface of the thick portion is about 27° (fourth line to fifth line in Paragraph 57 in Japanese Unexamined Patent Application Publication No. 2014-27505). Therefore, the +X-side inclined portion inclines toward the thin portion having an angle of about 63°. It is described that an angle between a crystal surface of the −X-side inclined portion and the normal line of the principal surface of the thick portion is about 55° (second line to third line in Paragraph 55 in Japanese Unexamined Patent Application Publication No. 2014-27505). Therefore, the −X-side inclined portion inclines toward the thin portion having an angle of about 35°. In the case of Japanese Unexamined Patent Application Publication No. 2014-27505, as illustrated in FIG. 8, an etching resist mask is exclusively used for forming the thick portion.

Against this related art, it has been desired another preferred structure for a connecting part of the thick portion and the thin portion. It has been desired a method where the etching resist mask exclusive for forming the thick portion can be omitted.

A need thus exists for a crystal unit and a manufacturing method of the crystal unit which are not susceptible to the drawback mentioned above.

SUMMARY

According to an aspect of this disclosure, there is provided a crystal unit that includes an AT-cut crystal element that has a planar shape in a rectangular shape and a part as a thick portion. The crystal element includes a first end portion, a depressed portion, the thick portion, and a second end portion in this order from a side of one short side in viewing a cross section taken along a longitudinal direction near a center of the short side. The depressed portion is disposed from the thick portion toward a side of the first end portion, and a surface of the depressed portion is depressed with a predetermined angle θa and subsequently bulged, and connected to the first end portion.

According to a manufacturing method of a crystal unit of this application, the crystal unit includes an AT-cut crystal element. The AT-cut crystal element has a planar shape in a rectangular shape and a part as a thick portion. The crystal element includes a first end portion, a depressed portion, the thick portion, and a second end portion in this order from a side of one short side in viewing a cross section taken along a longitudinal direction near a center of the short side. The depressed portion is disposed from the thick portion toward a side of the first end portion, and a surface of the depressed portion is depressed with a predetermined angle θa and subsequently bulged, and connected to the first end portion. The manufacturing method of the crystal unit includes preparing a quartz-crystal wafer for manufacturing a large count of the crystal elements, forming a wet etching resist mask on front and back surfaces of the quartz-crystal wafer, the wet etching resist mask forming an outer shape of the crystal element, the wet etching resist mask having an opening on a part of a region corresponding to the depressed portion, the opening not passing through the quartz-crystal wafer while a wet etching solution is allowed to enter the opening to an extent that the quartz-crystal wafer is etched by a desired amount, and dipping the quartz-crystal wafer on which the wet etching resist mask is formed in a wet etching solution for a predetermined period.

The crystal unit in this application includes a common crystal unit, a crystal unit installed in a package with an oscillator circuit to constitute a crystal controlled oscillator, a crystal unit that includes various temperature sensors such as a thermistor and a PN diode, and similar crystal unit.

The planar shape in the rectangular shape in this application includes an approximately rectangular shape in a range without damaging the object of this disclosure such that a rectangle has R-shaped corner portions.

BRIEF DESCRIPTION OF THE DRAWINGS

The foregoing and additional features and characteristics of this disclosure will become more apparent from the following detailed description considered with reference to the accompanying drawings.

FIG. 1A to FIG. 1C are explanatory drawings of an AT-cut crystal element 10 included in a crystal unit of an embodiment.

FIG. 11A to FIG. 11C are explanatory drawings of a preferable arranged position of an excitation electrode.

DESCRIPTION OF EMBODIMENTS

Figure 2A:
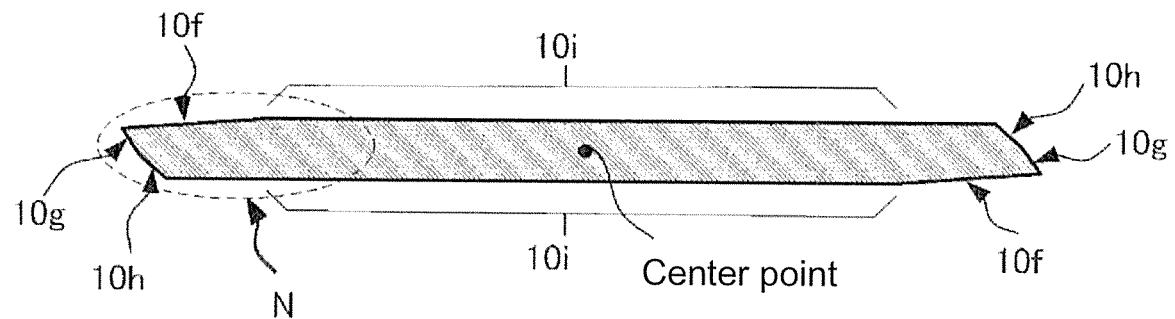
FIG. 2A and FIG. 2B are explanatory drawings of a side surface intersecting with especially a Z'-axis of the crystal element 10.

The following describes an embodiment of a crystal unit and a manufacturing method of the crystal unit according to the disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated here in some cases. Shapes, dimensions, materials, and similar factor described in the following embodiment are merely preferable examples within the scope of the disclosure. Therefore, the disclosure is not limited to only the following embodiment.

[1. Description of Crystal Unit]
[1-1. Structure]

Figure 2B:
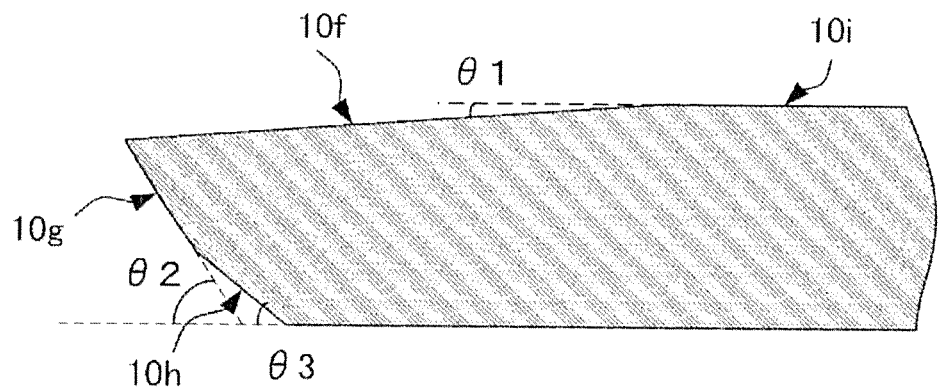

First, with reference to FIG. 1A to FIG. 2B, an AT-cut crystal element 10 included in a crystal unit of the embodiment will be described. FIG. 1A is a plan view of the crystal element 10, FIG. 1B is a sectional drawing of the crystal element 10 taken along the line IB-IB in FIG. 1A, and FIG. 1C is a sectional drawing of the crystal element 10 taken along the line IC-IC in FIG. 1A. FIG. 1B illustrates a first end portion 10a, a depressed portion 10b, and a second end portion 10d, which are features of the disclosure, enlarged for easy understanding, and illustrates a thick portion 10c while omitting a part of a region along a longitudinal direction of the crystal element 10 due to its limited space for the disclosure. FIG. 2A is an enlarged figure of FIG. 1C, and FIG. 2B is an enlarged figure of a part N in FIG. 2A.

Coordinate axes X, Y', and Z' illustrated in FIG. 1A are crystallographic axes of crystal in the AT-cut crystal element 10. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The crystal element 10 of this embodiment is an AT-cut crystal element that has a planar shape in a rectangular shape, a part as the thick portion 10c, a long side parallel to the X-axis of the crystal, a short side parallel to the Z'-axis of the crystal, and is formed from a crystal element having a predetermined direction angle.

Moreover, in viewing a cross section (namely the cross section taken along the line IB-IB) taken along the longitudinal direction near the center of the short side, the crystal element 10 includes the first end portion 10a, the depressed portion 10b, the thick portion 10c, and the second end portion 10d in this order from a side of one short side (in the case of FIG. 1A to FIG. 1C, the +X-side short side).

Moreover, as illustrated in especially FIG. 1B, the depressed portion 10b is a depressed portion that is disposed from the thick portion 10c toward a side of the first end portion 10a, and a surface of the depressed portion 10b is depressed with a predetermined angle θa and subsequently bulged, and connected to the first end portion 10a. The depressed portion 10b may have a slight protrusion region in its region.

Here, the angle θa is an angle between a principal surface of the thick portion 10c and an inclined surface of the depressed portion 10b on a thick portion 10c side, and is specifically 4 to 8°, and typically about 6°. While this angle θa has slight dispersion, experiments up to the present by inventors of the embodiment shows that the angle θa indicates 6±2° as described above.

As illustrated in FIG. 1B, the first end portion 10a is constituted of four surfaces and is formed to have a protrusion shape toward a +X-direction. The second end portion 10d is constituted of four surfaces and is formed to have a protrusion shape toward a −X-direction. The second end portion 10d may be constituted of five or more surfaces, for example, five or six surfaces.

In this crystal element 10, when a dimension from an edge on the first end portion 10a side of the thick portion 10c to a distal end of the first end portion 10a is defined as L (see FIG. 1A and FIG. 1B), L is a dimension that satisfies the following formula (1).

However, in the formula (1), n is an odd number, and λ is a wavelength of a flexure vibration that propagates along the X-axis of the crystal in the crystal unit, that is, an unnecessary vibration. Although n can theoretically have a small value such as 1 and 3, considering a long side dimension of an actual crystal element, n is a relatively large integer and the odd number equal to or more than double digits, although not limited to this. The wavelength of the flexure vibration has a unique value generated corresponding to an original vibration frequency of the crystal element 10, that is, a frequency of a thickness-shear vibration. For example, when the frequency the thickness-shear vibration is defined as F0, the wavelength of the flexure vibration has, for example, a value provided in the following formula (2) or similar formula. The reason why the formula (1) is proper is described in detail in a later description of a prototype result and a simulation result.

$$L = \lambda(n/4 \pm 0.25) \quad (1)$$

$$\lambda = 1943/F0 \sim 12.8 \quad (2)$$

Having the depressed portion 10b and defining the above-described dimension L as the dimension provided in the formula (1) can periodically obtain a range where a crystal impedance (CI) is small as described later. Moreover, as described later, this can reduce variation of the crystal impedance (CI) before and after the first end portion 10a of the crystal element 10 is fixed to a container for the crystal unit by, for example, a conductive adhesive.

In the case of this crystal element 10, as illustrated especially in FIG. 2B, each side surface (Z'-surface) intersecting with the Z'-axis of the crystal element 10 is a side surface constituted of three surfaces of a first surface 10f, a second surface 10g, and a third surface 10h. Moreover, the first surface 10f is a surface intersecting with a principal surface 10i of the crystal element 10, and a surface corresponding to a surface obtained by rotating the principal surface 10i by θ1 having the X-axis of the crystal as a rotation axis.

Furthermore, the crystal element 10 has the first surface 10f, the second surface 10g, and the third surface 10h intersecting in this order. Moreover, the second surface 10g is a surface corresponding to a surface obtained by rotating the principal surface 10i by θ2 having the X-axis of the crystal as a rotation axis, and the third surface 10h is a surface corresponding to a surface obtained by rotating the principal surface 10i by θ3 having the X-axis of the crystal as a rotation axis. The experiments by this applicant have shown that the angles θ1, θ2, and θ3 are preferably as follows: $\theta1 = 4° \pm 3.5°$, $\theta2 = -57° \pm 5°$, and $\theta3 = -42° \pm 5°$, and more preferably, $\theta1 = 4° \pm 3°$, $\theta2 = -57° \pm 3°$, and $\theta3 = -42° \pm 3°$. The angles θ1 to θ3 have been described in Japanese Unexamined Patent Application Publication No. 2016-197778 by this applicant, thus omitting the description here.

The side surface (Z'-surface) intersecting with the Z'-axis constituted of the predetermined three surfaces as described above preferably ensures reduction of unnecessary vibrations in a short side direction of the crystal element 10.

The crystal element 10 includes excitation electrodes 11 on front and back surfaces of the thick portion 10c, or on wider predetermined regions including the front and back surfaces, and furthermore, the crystal element 10 includes extraction electrodes 13 extracted from the excitation electrodes 11 to a side of one short side, specifically, the first end portion 10a side of the crystal element 10 (see, for example, FIG. 1A to FIG. 1C). The excitation electrode 11 and the extraction electrode 13 each can be formed of a laminated film of chrome and gold, typically.

Figure 3:
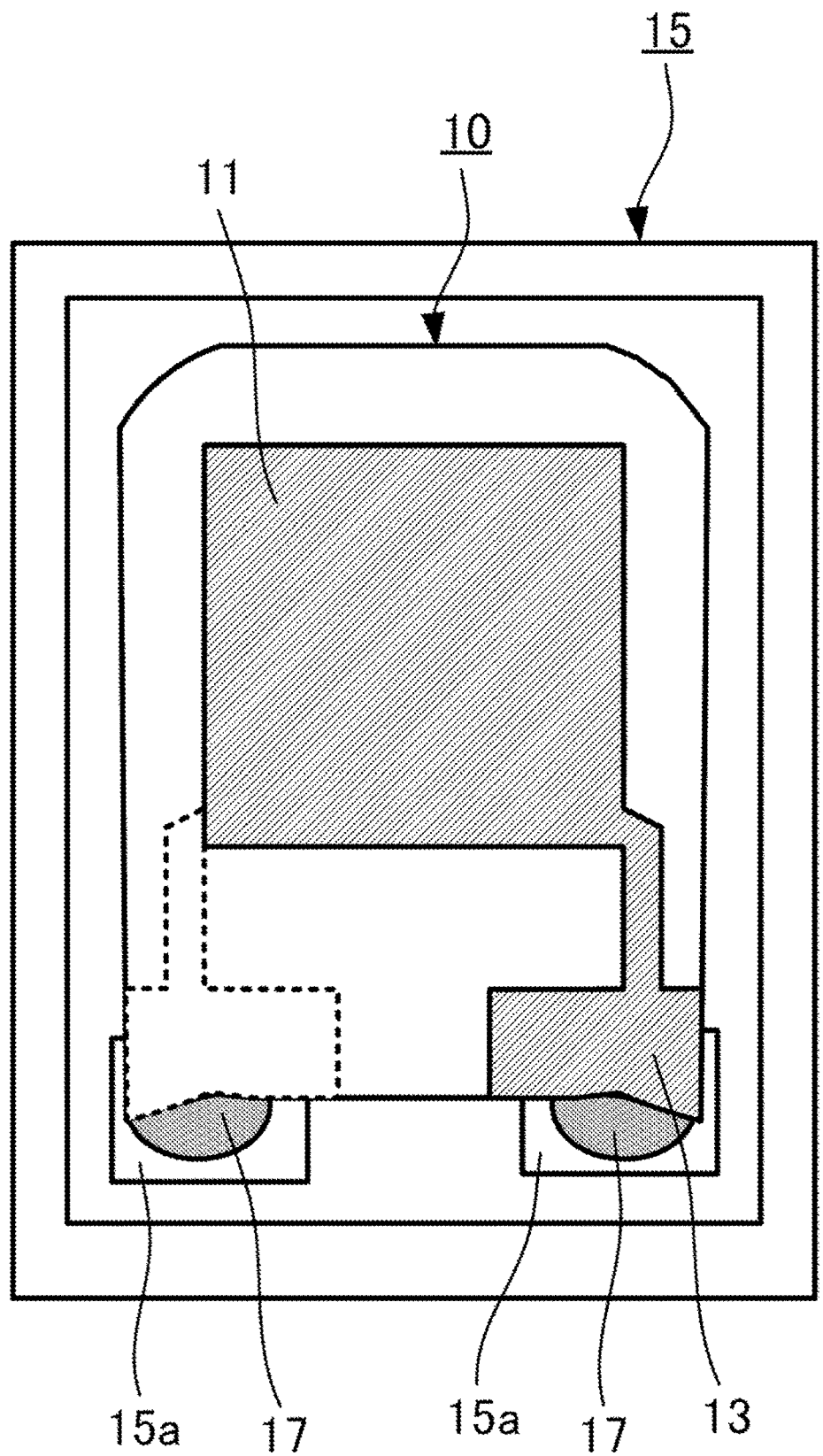
FIG. 3 is a plan view illustrating a state where the crystal element 10 is installed on a ceramic package.

As illustrated in FIG. 3, thus formed crystal element 10 is adhesively fixed into, for example, a well-known ceramic package 15 at a position of the extraction electrode 13 by, for example, a silicone conductive adhesive 17. Furthermore, the ceramic package is sealed in a sealing state of vacuum, an inert gas atmosphere, or similar atmosphere with a predetermined lid member (not illustrated), thus configuring the crystal unit of the embodiment. For describing the fixed position of the crystal element 10 in detail, as illustrated in FIG. 3, the crystal element 10 is fixed to adhesion pads 15a of the ceramic package 15 near both ends of the short side of the crystal element 10 on the first end portion 10a side by the conductive adhesive 17.

[1-2. Simulation Result and Prototype Result]

As a prototype crystal element 10 whose oscillation frequency has been set at a predetermined frequency, a plurality of types of prototype crystal elements whose dimensions L have been variously varied were manufactured each by a plurality of pieces. Then, using them, a plurality of types of crystal units in a working example having the above-described package structure and sealing structure were manufactured.

As a simulation model in a finite element method, a simulation model that is the above-described crystal element 10 and has the various varied dimensions L was prepared, and a relationship between the dimensions L and displacement at the first end portion 10a was examined.

Figure 4:
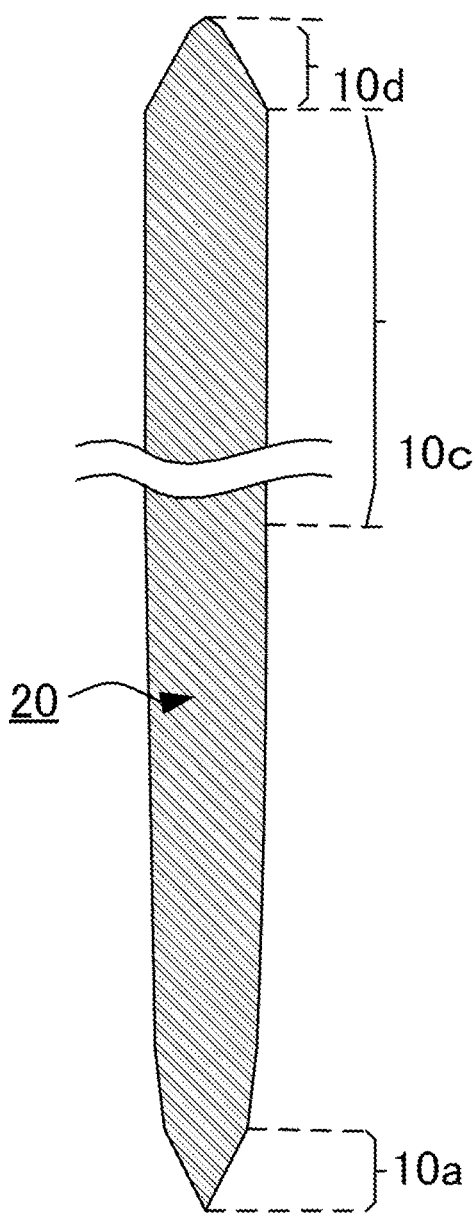
FIG. 4 is an explanatory drawing of a crystal element 20 of a comparative example.

As illustrated in a sectional drawing in FIG. 4 similar to FIG. 1B, a plurality of crystal elements 20 each having a configuration where the depressed portion 10b disposed in the working example is not disposed were manufactured as the crystal elements 20 of a comparative example. Then, those crystal elements 20 were used to manufacture crystal units of the comparative example having the above-described exemplary installation structure and sealing structure.

The following describes the above-described simulation result and prototype result.

Figure 5:
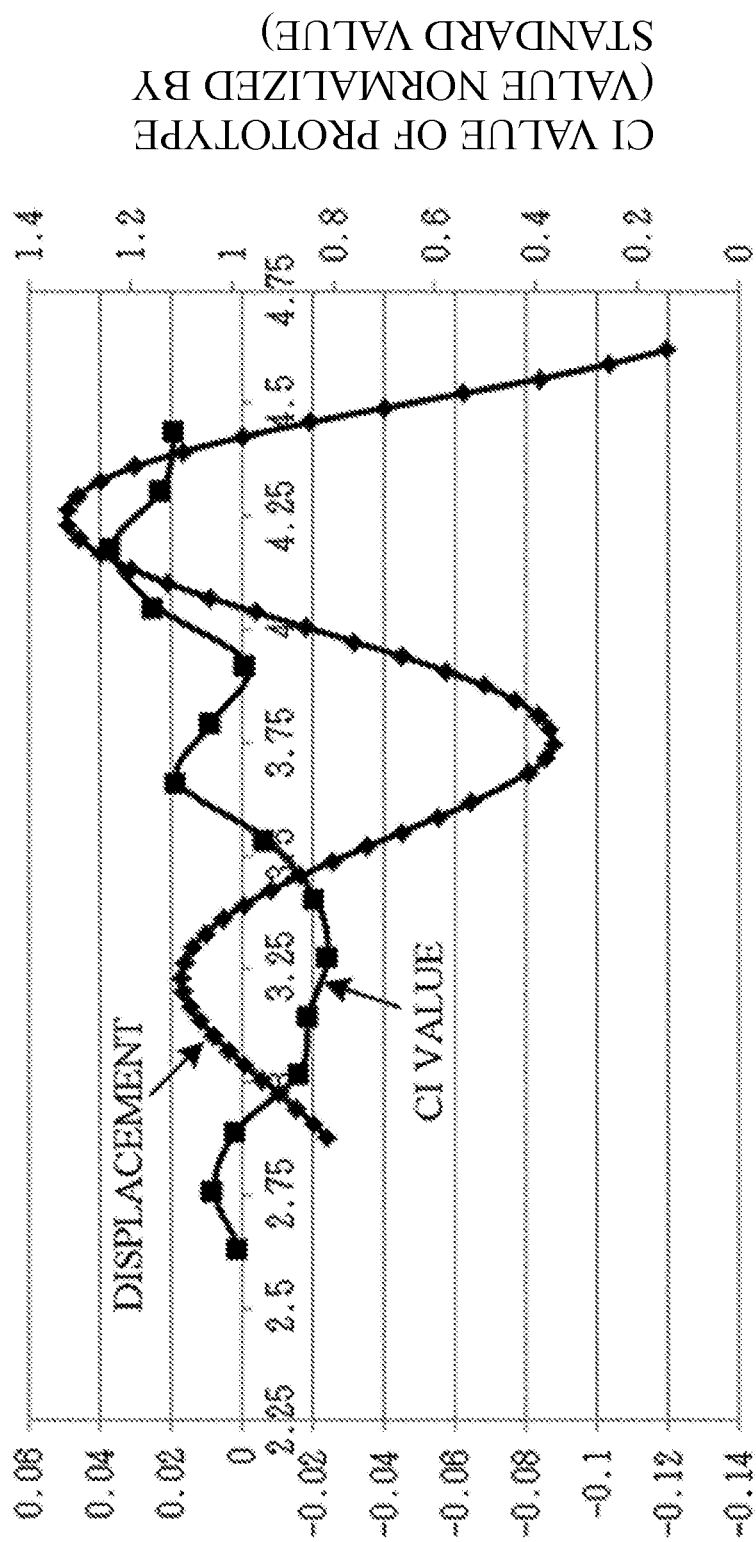
FIG. 5 is a drawing indicating a preferable range of a dimension L according to the disclosure with n/4 in a formula (1).

FIG. 5 is a drawing where a horizontal axis takes n/4 in the formula (1), a left vertical axis takes the displacement at a distal end point of the first end portion 10a, and a right vertical axis takes an average value of CI values by the plurality of types of crystal units manufactured as the prototypes to illustrate a relationship between the displacement and the CI value with respect to n/4. Therefore, FIG. 5 is a drawing illustrating the relationship between the displacement and the CI value with respect to the dimension L provided in the formula (1) where the wavelength λ is considered as a predetermined value.

However, the displacement is a displacement at the distal end point of the first end portion 10a of the crystal element 10, and a displacement provided in a definition as follows. That is, a positive displacement means that the distal end point of the first end portion 10a has been displaced to a positive side of a Y'-axis of the crystal element 10, and a negative displacement means that the distal end point of the first end portion 10a has been displaced to a negative side of the Y'-axis of the crystal element 10. Therefore, the smaller the absolute value of the displacement is, the more preferable the crystal element is.

The CI value of the right vertical axis is a value obtained by normalizing the average value of the CI values by the crystal units in the respective levels by a standard value required for this crystal unit. Therefore, the smaller than 1 the normalized CI value is, the more preferable the crystal element is.

FIG. 5 illustrates an examination result where n is in a range of 9 to 19, that is, L is in a range of 2.25 to 4.75. However, even if n is out of the range illustrated in FIG. 5, the range that satisfies the above-described formula (1) periodically appears, and the effect of the disclosure can be obtained in the respective regions.

The above-described prototype and simulation were performed in a condition where the dimension in the X-direction of the crystal element 10 is about 740 μm and the resonance frequency is 40 MHz. Obviously, these dimension and frequency are one example, and the disclosure is not limited to them.

FIG. 5 indicates that the displacement is in a local minimum range of 0.02 or less in the absolute value when n/4 is in a range of about 2.85 to 3.5. It is also seen that the CI value has a value of 1 or less, that is, satisfies the standard value when L is in the range of about 2.85 to 3.5. Here, when n is 13, n/4 is 3.25. Therefore, the range where n/4 is 2.85 to 3.5 is a range of −0.4 to +0.25 assuming n/4=3.25 when n is 13 as a reference. It is seen that both of the displacement and the CI value indicate desired values in this range. More preferably, in a case of a range of n/4=3.25±0.25, and further preferably, in a case of n/4=3.25±0.15, the displacement and the CI value are small. Thus, it is seen that the range of n/4=3.25±0.15 is good. The preferable actual dimension L of the crystal element 10 is as in the formula (1) and can be calculated by multiplying (n/4±0.25) by the wavelength $\lambda$. For example, in the above-described example, since the wavelength $\lambda$ is about 62 µm, the center value of L is about 200 µm as provided in L=3.25*62. A dimension along the X-axis of the crystal of the first end portion 10a is preferably, for example, around 50 µm, although not limited to this.

Figure 6A:
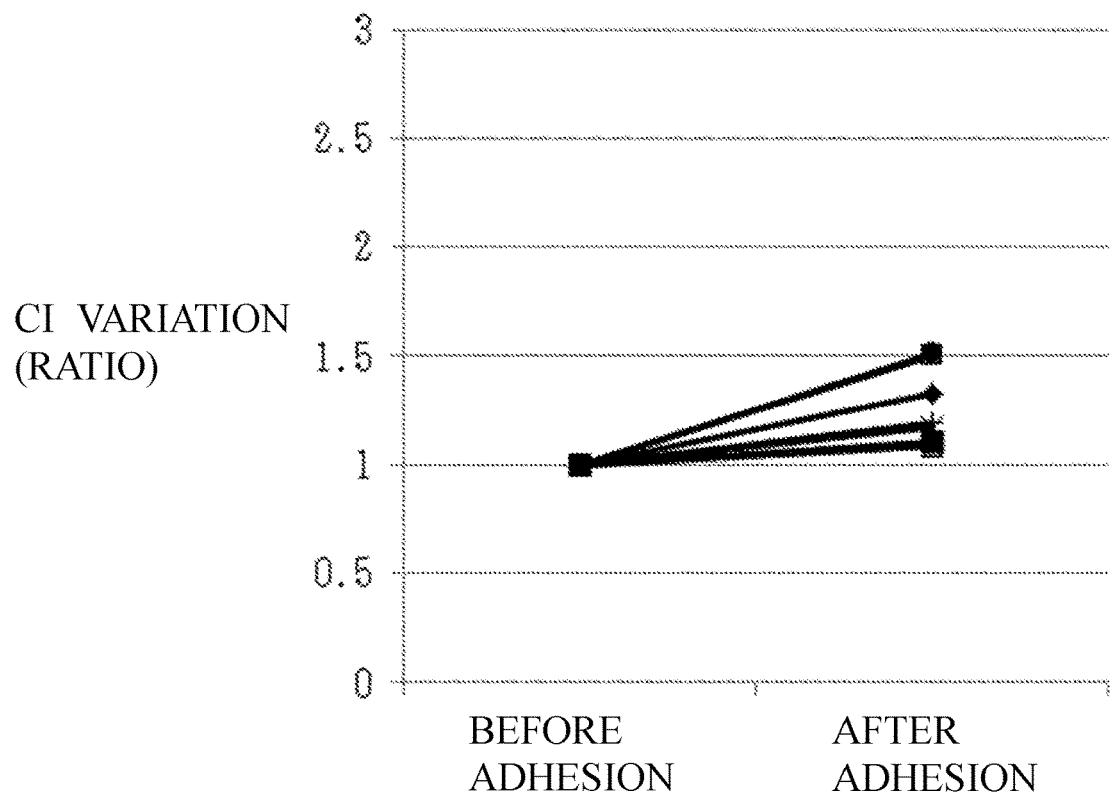
FIGS. 6A and 6B are explanatory drawings of a difference in CI variation before and after the respective crystal elements in a working example and the comparative example are adhered to a container.
Figure 6B:
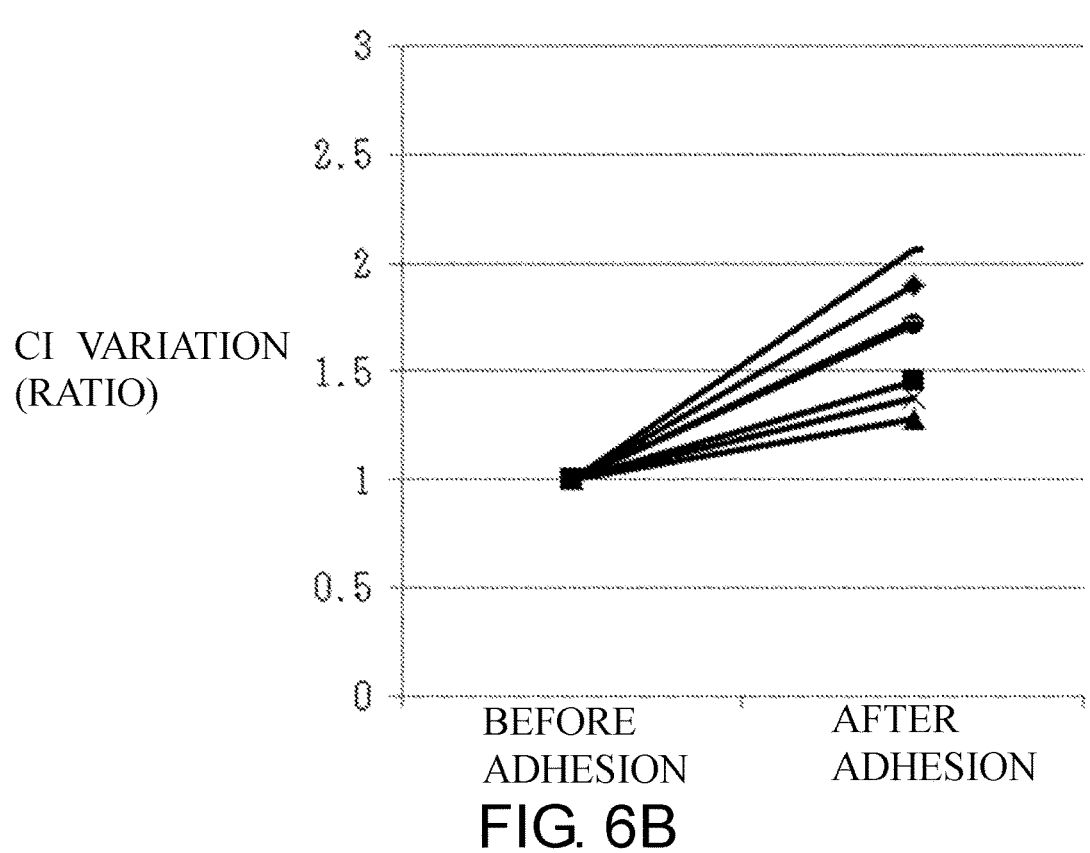

For the respective crystal elements of the working example and the comparative example manufactured as the prototypes, the CI values before being adhered to the container and the CI values after being adhered to the container are traced and confirmed one-on-one to examine change in the CI value before and after the adhesion. FIG. 6A and FIG. 6B illustrate its result and each take before the adhesion and after the adhesion in the horizontal axis and take a ratio of the CI values before and after the adhesion in the vertical axis. FIG. 6A illustrates the result of the crystal element 10 of the working example, and FIG. 6B illustrates the result of the crystal element 20 of the comparative example. The number of samples is seven in both cases. The CI value of the crystal element before the adhesion is a measurement value in the crystal element in a state connected to a frame in a wafer described later in a description of a manufacturing method.

In FIG. 6A and FIG. 6B, the CI variation ratio is 1.5 at a maximum in the crystal element of the working example, while the CI variation ratio exceeds 2 at a maximum in the crystal element of the comparative example, and moreover, the number of values that exceed 1.5 is four. Therefore, it is seen that, in the crystal element 10 of the working example, energy confinement in a vibrator is excellent compared with the comparative example.

[2. Description of Manufacturing Method]

Next, an embodiment of a manufacturing method of the crystal unit will be described with reference to FIG. 7A to FIG. 9C.

A large number of the crystal elements 10 of the embodiment can be manufactured from a quartz-crystal wafer by a photolithography technique and a wet etching technique. Therefore, the following drawings used for the description of an exemplary manufacturing method include plan views of a quartz-crystal wafer 10w and plan views illustrating an enlarged part M of the quartz-crystal wafer 10w. Furthermore, the drawings used for the description of the exemplary manufacturing method include sectional drawings of the crystal element 10 as well. Each sectional drawing illustrates a cross section taken along the line VIIC-VIIC, the line VIIIC-VIIIC, the line IXC-IXC, the line XIB-XIB or the line XIC-XIC in the corresponding plan view.

Figure 7A:
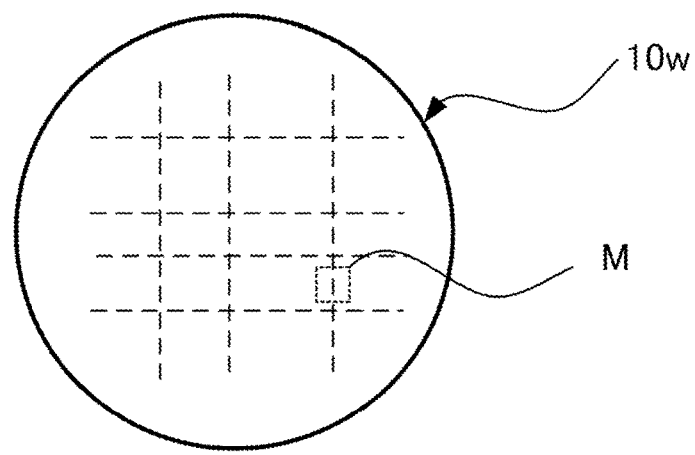
FIG. 7A to FIG. 7C are explanatory drawings of an exemplary manufacturing method of the crystal element 10.
Figure 7B:
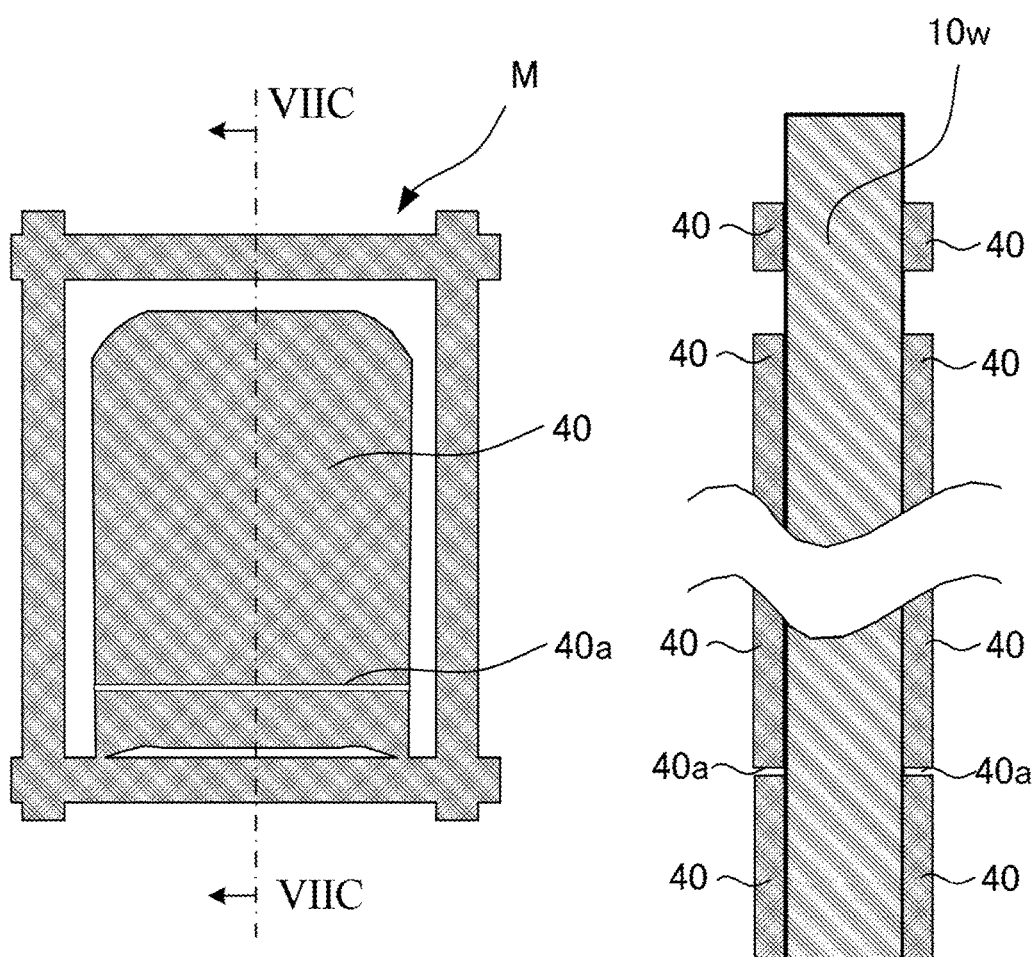
Figure 7C:
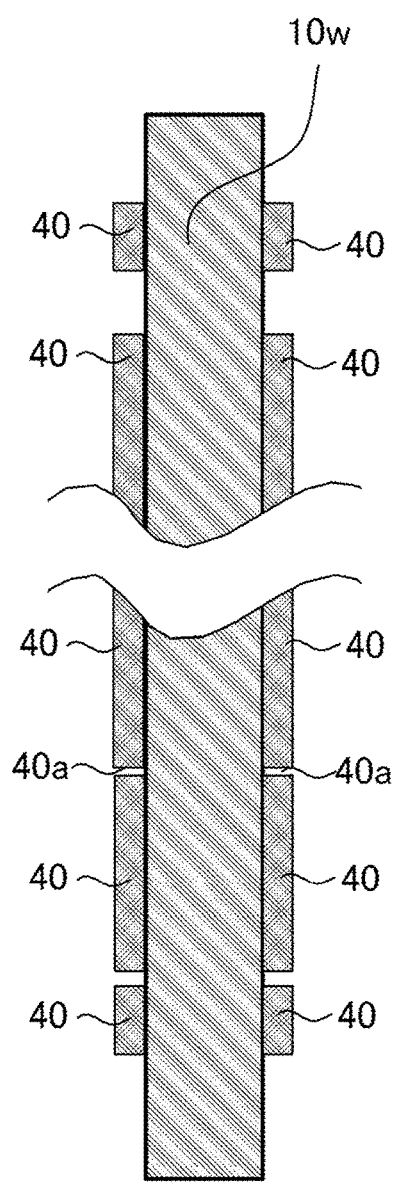

First, the quartz-crystal wafer 10w is prepared (FIG. 7A). While the oscillation frequency of the AT-cut crystal element 10 is, as well known, almost determined by the thickness of the principal surface (X-Z' surface) part of the crystal element 10, the quartz-crystal wafer 10w to be prepared is a wafer thicker than a final thickness of the crystal element 10.

Next, the well-known film forming technique and photolithography technique are used to form wet etching resist masks 40, which are masks to form an outer shape of the crystal element, on both front and back surfaces of the quartz-crystal wafer 10w. The wet etching resist masks 40 according to the embodiment are configured of a part corresponding to the outer shape of the crystal element, a frame part that holds each crystal element, and a connecting part that connects the crystal element to the frame part. However, in this embodiment, the wet etching resist mask is formed such that regions corresponding to the above-described depressed portion 10b (see FIG. 1A to FIG. 1C) has a part that has an opening 40a. The opening 40a does not pass through the quartz-crystal wafer, but a wet etching solution can enter the opening 40a to an extent that the quartz-crystal wafer is etched by a desired amount. Specifically, for example, the wet etching resist mask 40 formed of the laminated film of a chrome film and a gold film, and the wet etching resist mask 40 where this metal film is removed from a predetermined part to form the opening 40a is formed.

The opening 40a has a dimension along the thickness direction of the crystal element 10 such that the opening 40a does not pass through the quartz-crystal wafer, but a wet etching solution can enter the opening 40a to an extent that the quartz-crystal wafer is etched by a desired amount as described above, and the dimension is typically a few µm, for example, 2 µm. However, this value can be changed corresponding to the thickness of the quartz-crystal wafer 10w, the depth and the size of the depressed portion 10b, and similar factor. The dimension of the opening 40a along the short side direction of the crystal element 10 is preferred to be a dimension similar to the width dimension of the crystal element. However, this dimension can be changed to be wider or narrower corresponding to the thickness of the quartz-crystal wafer 10w, the size of the depressed portion 10b. While the number of the openings 40a is one in the example in FIG. 7A to FIG. 7C, not limiting to this, a plurality of openings 40a may be provided as being close to one another in the region corresponding to the depressed portion 10b. While the opening 40a has a planar shape in an extremely elongated rectangular shape in the example in FIG. 7A to FIG. 7C, this shape may be changed as well.

Next, the quartz-crystal wafer 10w on which the wet etching resist mask 40 has been formed is dipped in the wet etching solution for a predetermined period. For the etching solution, a hydrofluoric acid-based etchant is used. The predetermined period is a period where the etching solution can pass through the quartz-crystal wafer 10w so as to obtain a contour of an outer shape of the crystal element 10 plus something extra.

In this etching, since the etching solution sufficiently enters the opening of the quartz-crystal wafer 10w nearby a forming scheduled region of the crystal element 10 and is diffused, the etching proceeds to sufficiently pass through the quartz-crystal wafer 10w itself. On the other hand, since the opening 40a part has a narrow opening dimension, the wet etching solution enters the quartz-crystal wafer 10w part under the opening 40a little by little. Therefore, the wet etching solution does not lead to pass through the quartz-crystal wafer 10w, and the regions of the openings 40a and the quartz-crystal wafer 10w part under the mask nearby the regions of the openings 40a are etched.

Figure 8A:
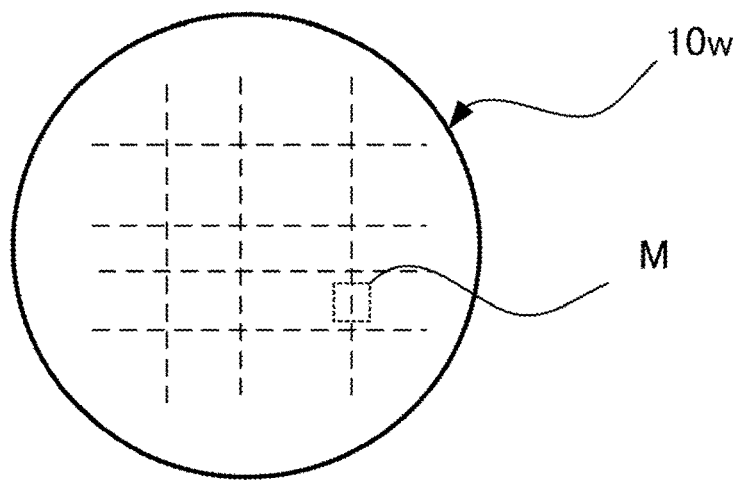
FIG. 8A to FIG. 8C are explanatory drawings of the exemplary manufacturing method of the crystal element 10 following FIG. 7A to FIG. 7C.
Figure 8B:
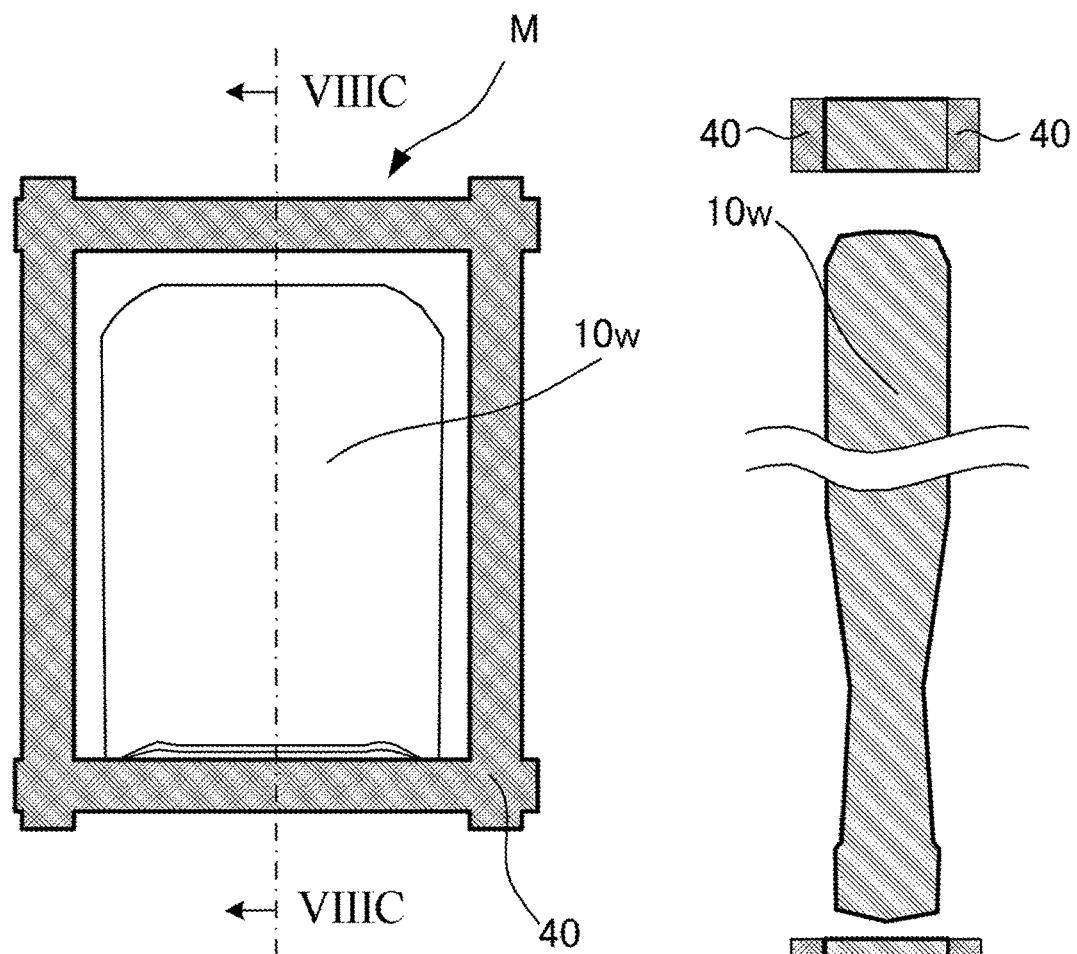
Figure 8C:
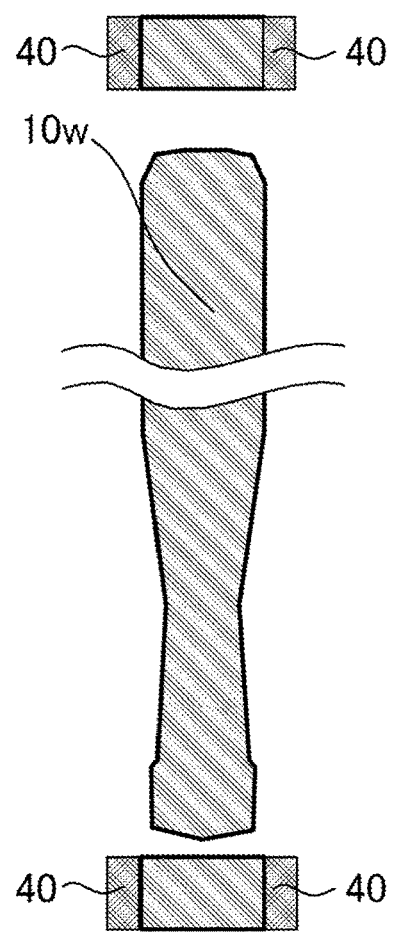

FIG. 8A to FIG. 8C illustrate a state of a sample where the above-described outer shape etching has terminated, and illustrate the wet etching resist mask 40 removed except the frame part. The quartz-crystal wafer 10w is obtained in an intermediate state before the first end portion 10a, the depressed portion 10b, the thick portion 10c, and the second end portion 10d are each completed.

Figure 9A:
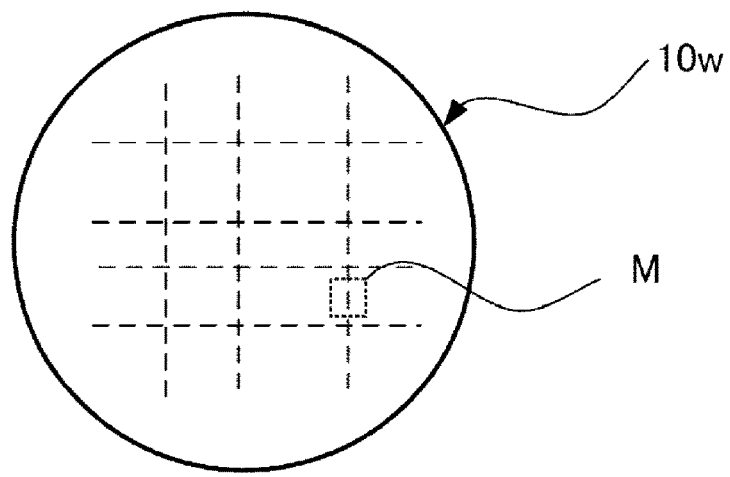
FIG. 9A to FIG. 9C are explanatory drawings of the exemplary manufacturing method of the crystal element 10 following FIG. 8A to FIG. 8C.
Figure 9B:
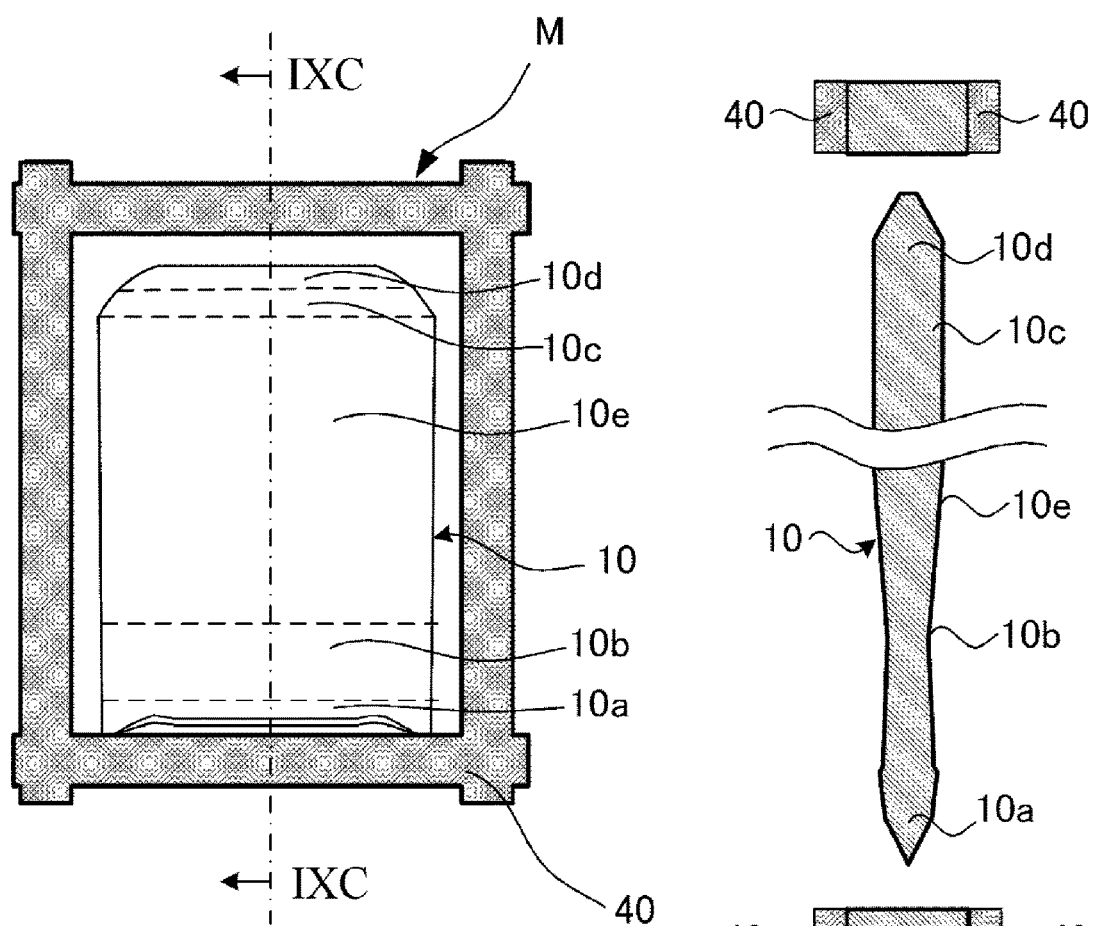
Figure 9C:
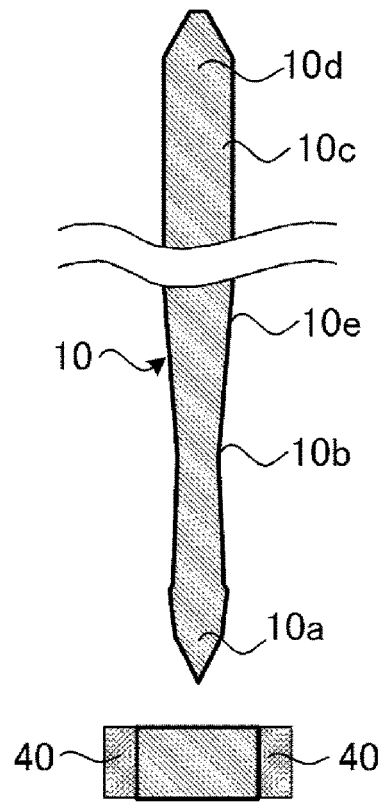

Next, this quartz-crystal wafer 10w in this intermediate state is dipped again in the etching solution mainly composed of hydrofluoric acid for a predetermined period. Here, the predetermined period is a period during which the thickness of the forming scheduled region for the thick portion 10c of the crystal element 10 can satisfy a specification of the oscillation frequency required for the crystal element 10, and the first to third surfaces 10f to 10h can be formed on a side surface intersecting with the Z'-axis of the crystal element 10. When this etching terminates, the main part of the crystal element 10 including the first end portion 10a, the depressed portion 10b, the thick portion 10c, and the second end portion 10d is completed as illustrated in FIG. 9A to FIG. 9C.

Next, the remaining part of the wet etching resist mask 40 is removed from the quartz-crystal wafer 10w after the above-described etching is performed to expose the entire crystal surface (not illustrated). After that, the well-known film formation method is used to form a metal film (not illustrated) for forming excitation electrodes and extraction electrodes of the crystal unit on the entire surface of the quartz-crystal wafer 10w. Next, the well-known photolithography technique and metal etching technique are used to process the metal film, thus the quartz-crystal wafer 10w that includes a large number of the crystal elements 10 illustrated in FIG. 1A to FIG. 1C is completed.

Next, an appropriate external force is applied to the connecting portion of each crystal element 10 of the quartz-crystal wafer 10w to separate the crystal element 10 from the quartz-crystal wafer 10w, thus separating into individual pieces. Thus formed crystal element 10 is installed in the container and sealed as described above, thus providing the crystal unit of the embodiment as illustrated in FIG. 3.

In the above-described manufacturing method, the predetermined opening 40a is provided to the wet etching resist mask 40 to perform the outer shape etching, thus ensuring simultaneously forming a precursor of the depressed portion 10b when the outer shape etching is performed. Accordingly, forming the depressed portion and the thick portion can be facilitated.

[3. Example that Supporting Portion is Set on −X-Side of Crystallographic Axis of Crystal (Modification)]

In the above-described embodiment, a supporting portion that supports the crystal element 10 is set on the +X-side of the crystallographic axis of the crystal, while the crystal element may be supported on the −X-axis side of the crystallographic axis of the crystal. The following describes the modification.

Figure 10:
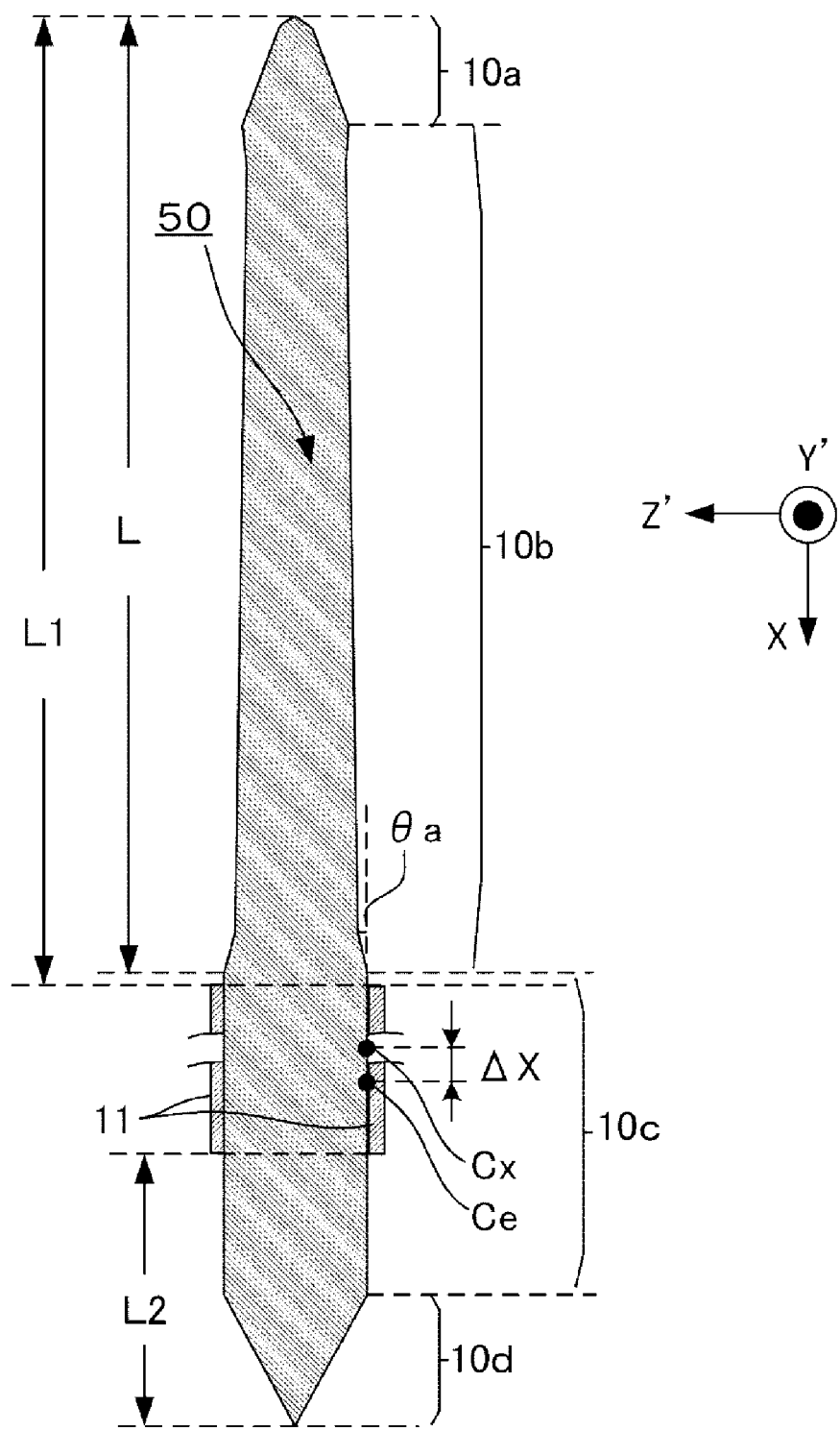
FIG. 10 is an explanatory drawing of another embodiment, and an explanatory drawing when a crystal element support is held on a −X-side of a quartz crystal axis.

FIG. 10 is an explanatory drawing of this modification, and a sectional drawing similar to FIG. 1B. A difference from the crystal element 10 in FIG. 1A to FIG. 1C of a crystal element 50 of this modification is that the first end portion 10a, the depressed portion 10b, the thick portion 10c, and the second end portion 10d are defined from the −X-side of the crystallographic axis of the crystal. However, because of anisotropy with respect to the wet etching solution of the crystallographic axis of the crystal, a predetermined angle θa in the crystal element 50 of this modification has a value different from the case of the crystal element 10 illustrated in FIG. 1A to FIG. 1C. Specifically, the predetermined angle θa in the crystal element 50 of the modification is 14 to 18°, and typically about 16°. While this angle θa has slight dispersion, experiments up to the present by inventors of the embodiment shows that the angle θa indicates 16±2° as described above.

Also in the case of this modification, the depressed portion is provided between the supporting portion and the thick portion, and moreover, the dimension L is defined as the predetermined dimension provided in the formula (1). Thus, an effect similar to that of the crystal element 10 illustrated in FIG. 1A to FIG. 1C can be expected.

[4. Embodiment Regarding Excitation Electrode]

In the above-described description, a position of the excitation electrode is not mentioned. However, the examination by the inventors according to this application has proved that the characteristic of the crystal unit improves when the position at which the excitation electrode 11 is disposed on the crystal element 10 including the first end portion 10a, the depressed portion 10b, the thick portion 10c, and the second end portion 10d is set in a predetermined range. The following describes this point with reference to FIG. 11A to FIG. 14.

FIG. 11A to FIG. 11C are plan views to describe a preferable arranged position of the excitation electrode with respect to the crystal element 10. This crystal unit includes respective excitation electrodes 11 on both front and back sides of the crystal element 10 and on the thick portion 10c. Moreover, the excitation electrodes 11 are disposed on the crystal element 10 such that, when a center point of the crystal element 10 in a direction along the long side of the crystal element 10, that is, a direction along the X-axis of the crystal is expressed as Cx and a center point of the excitation electrode 11 in the direction along the X-axis of the crystal is expressed as Ce, the center point Ce of the excitation electrode is decentered with a decentering amount ΔX to a side of the second end portion 10d with respect to the center point Cx of the crystal element, that is, to a side opposite to a side fixed by the conductive adhesive of the crystal element 10.

The following describes a proper range and an effect of the decentering amount ΔX. First, the inventors simulated an extent of change in the crystal impedance (CI) when changing the decentering amount ΔX of the excitation electrode variously in the finite element method, using a model of the crystal element 10 including the first end portion 10a, the depressed portion 10b, the thick portion 10c, and the second end portion 10d illustrated in FIG. 11A to FIG. 11C and the crystal element 10 where a long side dimension Lx is 778 μm, a short side dimension Lz is 570 μm, a length of the first end portion 10a is 71 μm, a dimension of the second end portion 10d is 60 μm, a dimension indicated as L in FIG. 11A to FIG. 11C is a dimension that satisfies the above-described formula (1), and a dimension from the edge on the first end portion 10a side of the thick portion 10c to deepest position of the depressed portion 10b is 74 μm, as one examination.

Figure 12A:
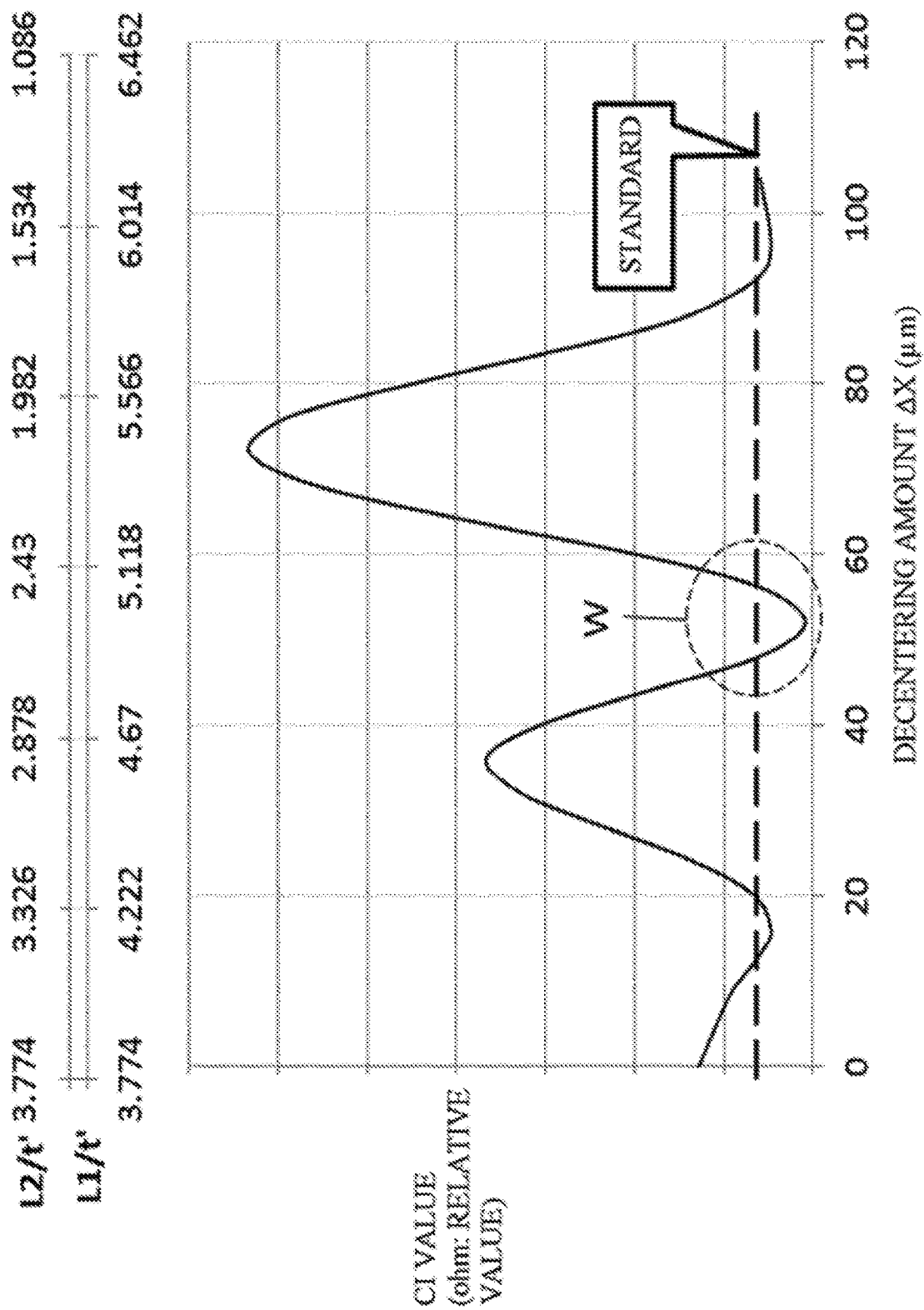
FIG. 12A and FIG. 12B are explanatory drawing of a simulation result of the preferable arranged position of the excitation electrode.
Figure 12B:
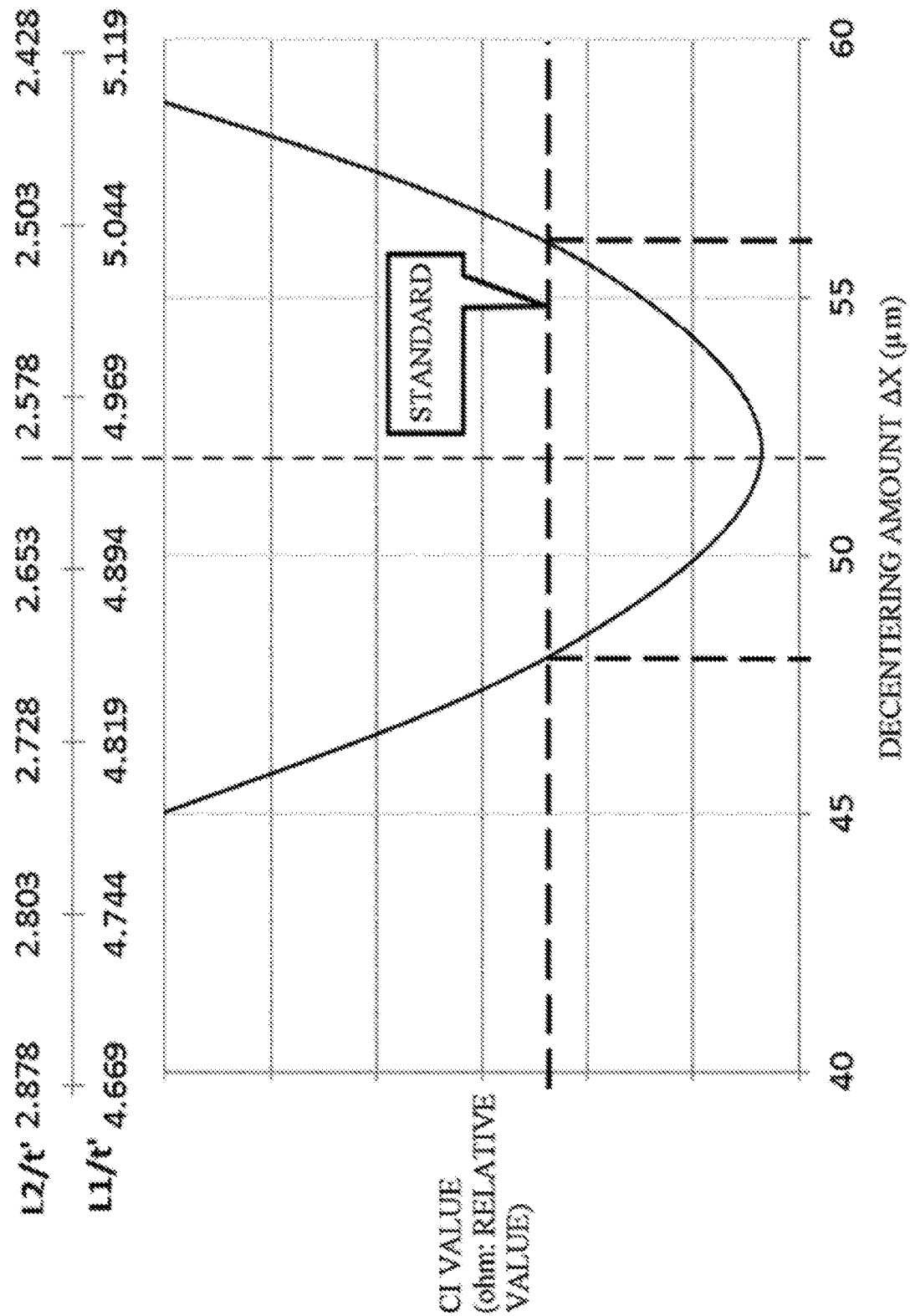

FIG. 12A and FIG. 12B illustrate this simulation result and each take the decentering amount ΔX in the horizontal axis and take the crystal impedance (CI, relative value) in the vertical axis to illustrate a relationship between the decentering amount ΔX and the CI. FIG. 12A takes the decentering amount ΔX in a wide range, and FIG. 12B is enlarged view of a part W in FIG. 12A. FIG. 12A and FIG. 12B also each illustrate L1/t' and L2/t', which are described later, as new horizontal axes on a top of the graph.

Figure 13:
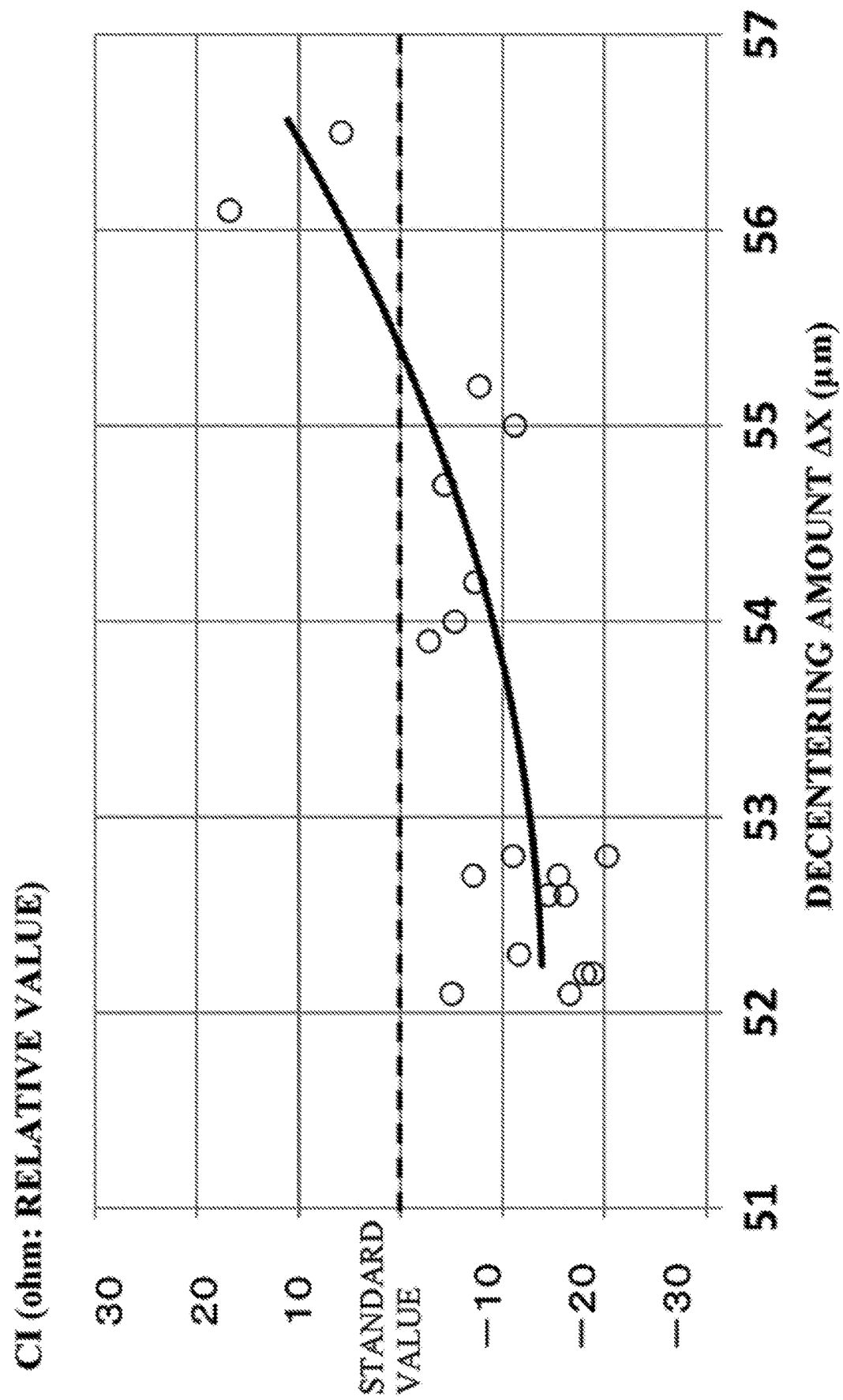
FIG. 13 is an explanatory drawing of a characteristic of a prototype when the arranged position of the excitation electrode is changed.

From FIG. 12A and FIG. 12B, it is able to understand that setting the decentering amount ΔX in a predetermined range decreases the CI value. Moreover, it is able to understand that the range where the CI value is small periodically appears. In more detail, it is able to understand that the decentering amount ΔX that can satisfy a standard (dashed lines indicated in FIG. 12A and FIG. 12B) of the crystal unit manufactured from this crystal element is in a range of 52±4 μm (especially see FIG. 12B). FIG. 13 illustrates a measured value of the CI when the crystal unit is actually manufactured as the prototype. Also from FIG. 13, it is able to understand that the CI is in a local minimum range when the decentering amount ΔX is around 52 μm, and that the standard of the CI is not satisfied when the decentering amount ΔX exceeds 56 μm. Also from this prototype result, it is able to understand that the decentering amount ΔX is preferably in the range of 52±4 μm. In the case of the prototype, a level where the decentering amount ΔX is smaller than 52 μm was not performed for certain reasons. However, it can be estimated that the CI is small similarly to the simulation, even when the decentering amount ΔX is smaller than 52 μm by around 4 μm.

Here, in the case of the AT-cut crystal unit, various design thoughts for the crystal unit are not limited to the crystal element at a single frequency and are widely applicable to, for example, the crystal element where values obtained by normalizing the long side dimension Lx and the short side dimension Lz of the crystal element by a thickness to of the thick portion of the crystal element are similar values. Thus, it can be estimated that the crystal element to which the above-described decentering amount ΔX is applicable is not limited to the crystal element whose oscillation frequency is 37.4 MHz.

The decentering amount of the excitation electrode also can be expressed by a position of an end portion in the longitudinal direction of the electrode insofar as the long side dimension Lx of the crystal element is determined. As illustrated in FIG. 1A to FIG. 1C and FIG. 10, when a distance from an end on the first end portion side of the excitation electrode to the distal end of the first end portion of the crystal element is defined as L1, and a distance from an end on the second end portion side of the excitation electrode to the distal end of the second end portion of the crystal element is defined as L2, insofar as Lx is 778 μm, L1=221±4 μm and L2=116±4 μm. When L1 and L2 are normalized by a sum of the thickness of the thick portion and effective thicknesses of the excitation electrodes on both front and back sides t'=1670/F, L1/t'=4.949±0.090 and L2/t'=2.598±0.090.

In viewing the decentering amount ΔX in a wide range in FIG. 12A and FIG. 12B, it is predicted that the CI improves with a period of about λ/2. At this time, using integers n1 and n2, the position of the end portion of the electrode can be expressed by L1/t'=4.949±0.101+0.745×n1 and L2/t'=2.598±0.101+0.745×n2.

However, n1 and n2 are the integers and values that satisfy n1≥−6 and n2≥−3. When n1 and n2 do not satisfy this condition, the excitation electrode expands out of the region of the crystal element. That is, the excitation electrode is larger than the crystal element. Moreover, a relationship between n1 and n2 is a relationship that satisfies n2−n1≤3. The reason of such relationship is that n1 and n2 need to satisfy the relationship of n2−n1≤3 to satisfy the requirement of the disclosure that the excitation electrode is decentered to the second end portion side of the crystal element. Preferably, n1=n2=0.

Figure 14:
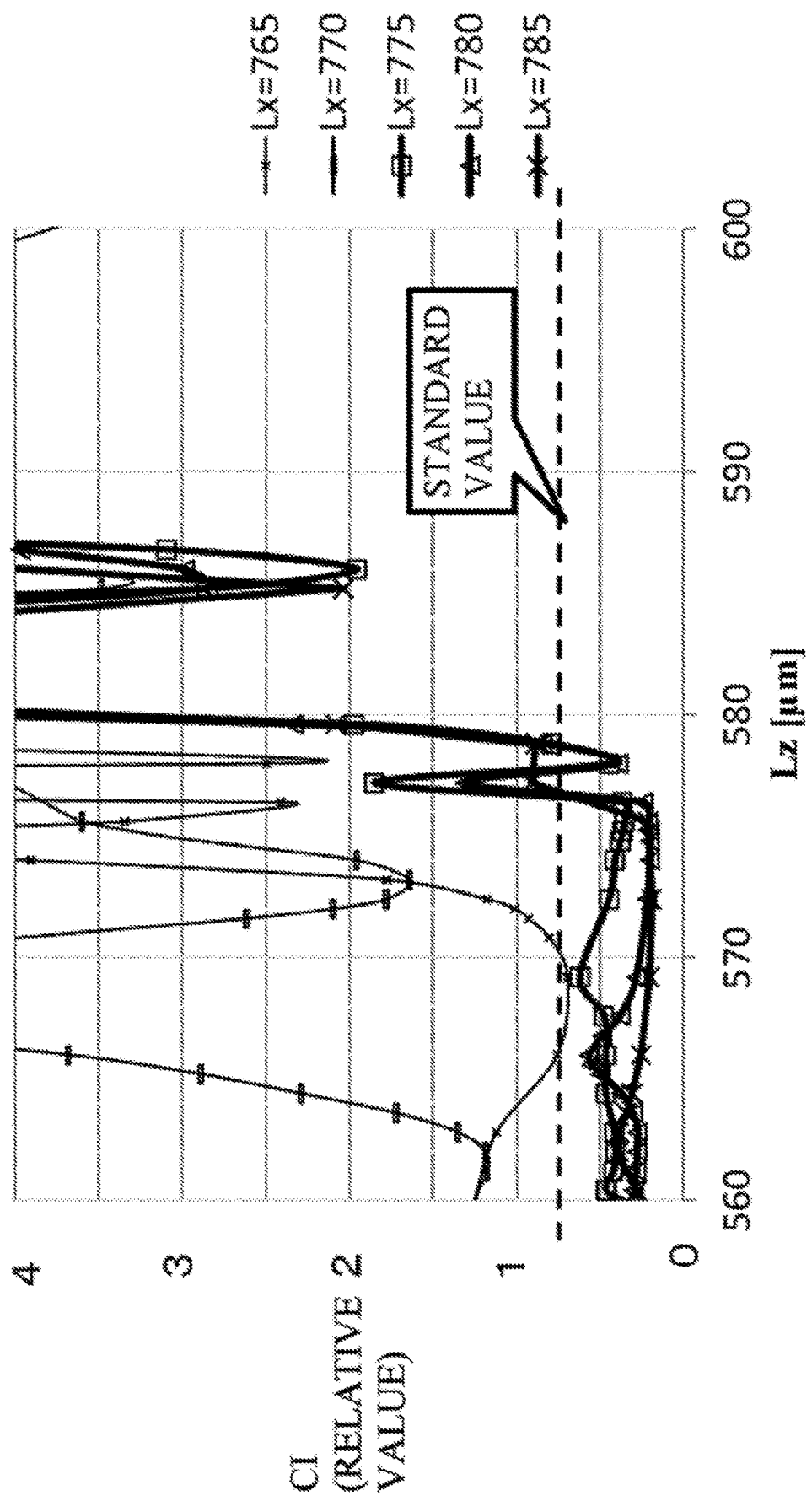
FIG. 14 is an explanatory drawing of a size of a crystal element to which the preferable arrangement of the excitation electrode is applicable.

On the other hand, in the case of the AT-cut crystal unit, insofar as the long side dimension and the short side dimension of the crystal element are in a certain range, for example, the CI value can satisfy the standard, but the CI tends to get worse when the long side dimension and the short side dimension of the crystal element exceed this range. The inventors examined this point in the finite element method. FIG. 14 illustrates its result.

FIG. 14 illustrates a difference of the CIs of various crystal elements where the long side dimension Lx of the crystal element 10 is set in a plurality of levels in a range of 765 to 785 μm and the short side dimension Lz is set in a plurality of levels in a range of 560 to 600 μm.

From FIG. 14, when Lx/ta and Lz/ta that satisfy the standard of the CI are examined, in an example where the frequency is 37.4 MHz, the thickness to of the thick portion of the crystal element is 39.748 μm, and Lx that seems to satisfy the standard value of the CI in FIG. 14 is 775 to 785 μm and Lz is 560 to 576 μm. Thus, it is able to understand that the CI standard is satisfied when 19.50≤Lx/ta≤19.75 and 14.08≤Lz/ta≤14.49.

In order to make the CI a value that satisfies the standard and is smaller than the standard, since Lx is 780 to 785 μm and Lz is 568 to 576 μm from FIG. 14, it is seen that it is good that 19.62≤Lx/ta≤19.75 and 14.29≤Lz/ta≤14.49.

Therefore, a preferred relationship of the long side, the short side, and the thickness (including the thicknesses of the excitation electrodes) of the crystal element to which the decentering amount ΔX of the excitation electrode is applied is preferably 19.50≤Lx/ta≤19.75 and 14.08≤Lz/ta≤14.49, and more preferably 19.62≤Lx/ta≤19.75 and 14.29≤Lz/ta≤14.49.

In above-described description, the example that the excitation electrode is disposed on the thick portion of the crystal element has been described. However, the thought of the decentering amount ΔX of the excitation electrode is also applicable to a case where the excitation electrode is disposed over a wider range including the thick portion of the crystal element.

The crystal unit of the embodiment provides the crystal unit that has the predetermined depressed portion between the thick portion and the first end portion. The depressed portion provides a novel mesa structure where the crystal element has the thickness once decreased from the thick portion toward the first end portion of the crystal element and subsequently increased. With this mesa structure, vibration is properly confined to the thick portion compared with a simple mesa structure. In view of this, the improvement of the characteristics of the crystal unit is ensured.

According to the manufacturing method of the crystal unit of the embodiment, the predetermined opening is provided on the mask for processing the outer shape of the crystal element, thus ensuring the simultaneous processing on the depressed portion in the processing of the outer shape of the crystal element. Accordingly, the crystal unit that has the desired thick portion can be formed without using a mask exclusive for forming the thick portion.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A crystal unit comprising
an AT-cut crystal element that has a nearly-rectangular shape in a plan view and a part as a thick portion, wherein:
the AT-cut crystal element includes a first end portion, a depressed portion, the thick portion, and a second end portion in this order from a side of one short side, in viewing a cross section taken along a longitudinal direction near a center of the short side of the AT-cut crystal element, and the depressed portion is disposed from the thick portion toward a first end portion side, and a surface of the depressed portion is depressed with a predetermined angle θa and subsequently bulged, and connected to the first end portion, wherein when a dimension from an edge on a side of the first end portion of the thick portion to a distal end of the first end portion is defined as L, the L satisfies a following formula (1), in the formula (1), n is an odd number, and λ is a wavelength of a flexure vibration that propagates along an X-axis of a crystal in the crystal unit, $$L=\lambda(n/4\pm0.25) \quad (1).$$

2. The crystal unit according to claim 1, wherein
the AT-cut crystal element has a long side parallel to an X-axis of a crystal in the crystal unit and a short side parallel to a Z'-axis of the crystal, and
the first end portion is positioned on a +X-side.

3. The crystal unit according to claim 1, wherein
the AT-cut crystal element has a long side parallel to an X-axis of a crystal in the crystal unit and a short side parallel to a Z'-axis of the crystal,
the first end portion is positioned on a +X-side, and
the predetermined angle θa is 6°±2°.

4. The crystal unit according to claim 1, wherein
the AT-cut crystal element has a long side parallel to an X-axis of a crystal in the crystal unit and a short side parallel to a Z'-axis of the crystal, and
the first end portion is positioned on a −X-side.

5. The crystal unit according to claim 1, wherein
the AT-cut crystal element has a long side parallel to an X-axis of a crystal in the crystal unit and a short side parallel to a Z'-axis of the crystal,
the first end portion is positioned on a −X-side, and
the predetermined angle θa is 16°±2°.

6. The crystal unit according to claim 1, wherein
when a dimension from an edge on a side of the first end portion of the thick portion to a distal end of the first end portion is defined as L, the L satisfies a following formula (1), in the formula (1), n is an odd number, and λ is a wavelength of a flexure vibration that propagates along an X-axis of a crystal in the crystal unit, $$L=\lambda(n/4\pm0.15) \quad (1).$$

7. The crystal unit according to claim 1, wherein
the AT-cut crystal element is fixed to a container of the crystal unit on a side of the first end portion by a fixing member.

8. The crystal unit according to claim 1, further comprising:

respective excitation electrodes on the thick portion or a wider region including the thick portion in front and back sides of the AT-cut crystal element, wherein when a center point in a direction along a long side of the AT-cut crystal element is expressed as Cx, and a center point in a direction along the long side of the excitation electrode is expressed as Ce, the excitation electrodes are disposed on the AT-cut crystal element such that the center point Ce is decentered to a side of the second end portion with respect to the center point Cx with a decentering amount ΔX.

9. The crystal unit according to claim 8, wherein
the decentering amount ΔX is 52±4 μm.

10. The crystal unit according to claim 8, wherein
when a distance from an end on the first end portion side of the excitation electrode to a distal end of the first end portion is expressed as L1,
a distance from an end on a second end portion side of the excitation electrode to a distal end of the second end portion is expressed as L2, and
an effective sum of a thickness of the thick portion and thicknesses of the excitation electrodes on the front and back sides is expressed as t'=1670/F,
L1/t'=4.949±0.090+0.745×n1, and
L2/t'=2.598±0.090+0.745×n2,
where n1 and n2 are integers and values that satisfy n1 ≥−6, n2 ≥−3, and
n2−n1 ≤3, and
F is an oscillation frequency of the crystal unit.

11. The crystal unit according to claim 8, wherein
when a thickness of the thick portion is expressed as ta,
a dimension of the long side of the AT-cut crystal element is expressed as Lx, and
a dimension of the short side of the AT-cut crystal element is expressed as Lz,
19.50≤Lx/ta≤19.75, and
14.08≤Lz/ta≤14.49.

12. The crystal unit according to claim 8, wherein
when a thickness of the thick portion is expressed as ta,
a dimension of the long side of the AT-cut crystal element is expressed as Lx, and
a dimension of the short side of the AT-cut crystal element is expressed as Lz,
19.62≤Lx/ta≤19.75, and
14.29≤Lz/ta≤14.49.

* * * * *